(12) United States Patent
Newsome (10) Patent No.: US 9,620,718 B2
(45) Date of Patent: Apr. 11, 2017

(54) METHOD FOR PREPARING A SEMICONDUCTING LAYER

(71) Applicant: Cambridge Display Technology Limited, Godmanchester (GB)

(72) Inventor: Christopher Newsome, St. Ives (GB)

(73) Assignee: Cambridge Display Technology Limited, Godmanchester (GB)

(*) Notice: Subject to any disclaimer, the term of this patent is extended or adjusted under 35 U.S.C. 154(b) by 138 days.

(21) Appl. No.: 14/409,804

(22) PCT Filed: Jun. 17, 2013

(86) PCT No.: PCT/GB2013/000267
§ 371 (c)(1),
(2) Date: Dec. 19, 2014

(87) PCT Pub. No.: WO2013/190255
PCT Pub. Date: Dec. 27, 2013

(65) Prior Publication Data
US 2015/0188053 A1  Jul. 2, 2015

(30) Foreign Application Priority Data
Jun. 19, 2012 (GB) .................................. 1210858.5

(51) Int. Cl.
*H01L 51/00* (2006.01)
*H01L 21/02* (2006.01)
*H01L 51/05* (2006.01)

(52) U.S. Cl.
CPC .... *H01L 51/0039* (2013.01); *H01L 21/02118* (2013.01); *H01L 51/0007* (2013.01);
(Continued)

(58) Field of Classification Search
CPC ... H01L 21/02109; H01L 21/64; H01L 21/70; H01L 21/71; H01L 21/8232; H01L 51/0028
See application file for complete search history.

(56) References Cited

U.S. PATENT DOCUMENTS

2004/0225056 A1  11/2004  Spreitzer et al.
2005/0067949 A1   3/2005  Natarajan et al.
(Continued)

FOREIGN PATENT DOCUMENTS

| EP | 1083775 A1 | 3/2001 |
|---|---|---|
| EP | 1850368 A1 | 10/2007 |

(Continued)

OTHER PUBLICATIONS

International Search Report and Written Opinion mailed Jan. 7, 2014 for International Application No. PCT/GB2013/000267.
(Continued)

*Primary Examiner* — Cheung Lee
(74) *Attorney, Agent, or Firm* — Wolf, Greenfield & Sacks, P.C.

(57) ABSTRACT

A method for preparing a semiconducting layer of an organic electronic device comprising: (i) depositing said semiconducting layer from a solution comprising a polymeric semiconductor, a non-polymeric semiconductor, a first aromatic solvent and a second aromatic solvent, wherein said second aromatic solvent has a boiling point that is at least 15° C. higher than the boiling point of said first aromatic solvent; and (ii) heating said deposited layer to evaporate said solvent, wherein said first aromatic solvent is of formula (I): wherein $R^1$ is selected from $C_{1-6}$ alkyl and $OC_{1-6}$ alkyl; and $R^2$ and $R^3$ are each independently selected from H and $CC_{1-6}$ alkyl.

20 Claims, 4 Drawing Sheets

(52) U.S. Cl.
CPC ...... *H01L 51/0035* (2013.01); *H01L 51/0074* (2013.01); *H01L 51/0566* (2013.01); *H01L 51/0026* (2013.01); *H01L 51/0043* (2013.01); *H01L 51/0512* (2013.01)

(56) References Cited

U.S. PATENT DOCUMENTS

| | | |
|---|---|---|
| 2009/0217974 A1 | 9/2009 | Chen et al. |
| 2010/0043876 A1 | 2/2010 | Tuttle et al. |

FOREIGN PATENT DOCUMENTS

| | | |
|---|---|---|
| GB | 2466843 A | 7/2010 |
| GB | 2482974 A | 2/2012 |
| WO | WO 2012/074909 A1 | 6/2012 |

OTHER PUBLICATIONS

International Preliminary Report on Patentability mailed Dec. 31, 2014 for International Application No. PCT/GB2013/000267.

Office Communication dated Oct. 22, 2012 for Great Britain Application No. GB1210858.5.

METHOD FOR PREPARING A SEMICONDUCTING LAYER

RELATED APPLICATIONS

The present application is a national stage filing under 35 U.S.C. §371 of international PCT application, PCT/GB2013/000267, filed Jun. 17, 2013, which claims priority to United Kingdom patent application, GB 1210858.5, filed Jun. 19, 2012, each of which is incorporated herein by reference.

FIELD OF THE INVENTION

The present invention relates to a method for preparing a semiconducting layer of an organic electronic device and in particular to a method of preparing a thin film transistor comprising a semiconducting layer prepared by the method. The invention is also concerned with blends for preparing the semiconducting layer and with organic electronic devices comprising a semiconducting layer prepared by the methods of the invention.

BACKGROUND

Transistors may be formed by processes wherein their semiconducting layer, and in many cases, other layers is deposited from solution. The resulting transistors are called thin-film transistors. When an organic semiconductor is used in the semiconducting layer, the device is often described as an organic thin film transistor (OTFT).

Various arrangements for OTFTs are known. One device, an insulated gate-field effect transistor, comprises source and drain electrodes with a semiconducting layer disposed therebetween in a channel region, a gate electrode disposed over the semiconducting layer and a layer of insulating material disposed between the gate electrode and the semiconductor in the channel region.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the transistor, namely the channel region between the source and drain electrodes. Thus in order to achieve high drain currents with low operational voltages, organic thin film transistors must have an organic semiconducting layer which has highly mobile charge carriers in the channel region.

High mobility OTFTs containing small molecule organic semiconductors have been reported and the high mobility has been attributed, at least in part, to the highly crystalline nature of the semiconductor. Particularly high mobilities have been reported in single crystal OTFTs wherein the organic semiconductor is deposited by thermal evaporation (see, for example, Podzorov et al, Appl. Phys. Lett., 2003, 83(17), 3504-3506).

Unfortunately, however, it can be difficult to obtain repeatable results from solution processed films of small molecule semiconductors and this is believed to be due to their poor film forming properties. Issues with material reticulation from and adhesion to substrates, film roughness and film thickness variations can limit the performance of small molecule semiconductors in OTFTs. Film roughness can be a further problem for top gate organic thin film transistors as the accumulation layer is formed at the uppermost surface of the semiconducting layer.

To overcome this problem, the use of blends of small molecule semiconductor and polymers, especially polymeric semiconductors, has been developed. The motivation for using such blends is primarily to overcome the poor film forming properties of the small molecule semiconductors. Blends exhibit superior film forming properties due to the film forming properties of the polymer. Numerous examples of small molecule semiconductor and polymeric semiconductor blends can be found in the literature.

Blends of small molecule semiconductor and polymeric semiconductor may be solution processed, e.g. by spin coating or ink jet printing, to form a semiconducting layer. Generally the process involves dissolving the semiconductors in a solvent, spin coating or ink jet printing the solution onto a substrate and then drying the resulting wet film. During the drying step, the solvent evaporates to yield the semiconducting layer comprising a matrix of polymer semiconductor comprising crystals of small molecule semiconductor.

Generally an aromatic or substituted aromatic solvent is used to dissolve the semiconductors. Most commonly o-xylene is used. The driving factor in the selection of this solvent is the fact that it dissolves both small molecule and polymeric semiconductors and it evaporates quickly to form the semiconducting layer.

GB2482974, however, discloses a method of making OTFTs wherein a solvent selected from $C_{1-4}$ alkoxybenzene and $C_{1-4}$ alkyl substituted $C_{1-4}$ alkoxybenzenes is used instead of o-xylene. The specific solvents exemplified are o-xylene, tetralin, 3,4-dimethylanisole, anisole and mesitylene. GB2482974 teaches that the mobilities achieved by the use of anisole compared to the other solvents is greater and as a consequence the device performance is improved. The improved device performance is realised at short channel lengths due to a reduction in contact resistance when such solvents are used.

Most of the prior art relating to small molecule and polymeric semiconductor blends have focussed on selection of certain semiconductors and their ratios in the blend in order to optimise the field effect mobility.

SUMMARY OF INVENTION

Viewed from a first aspect, the present invention provides a method for preparing a semiconducting layer of an organic electronic device comprising:
(i) depositing said semiconducting layer from a solution comprising a polymeric semiconductor, a non-polymeric semiconductor, a first aromatic solvent and a second aromatic solvent, wherein said second aromatic solvent has a boiling point that is at least 15° C. higher than the boiling point of said first aromatic solvent; and
(ii) heating said deposited layer to evaporate said solvent.

Viewed from a further aspect, the present invention provides a method of making an organic thin film transistor comprising a substrate, source and drain electrodes having a channel region located in between them, a semiconducting layer extending across the channel region and in electrical contact with the source and drain electrodes, a gate electrode and an insulating layer between the gate electrode and the semiconducting layer, wherein the semiconducting layer is deposited by a method as hereinbefore described.

Viewed from a still further aspect, the present invention provides an organic electronic device, e.g. a thin film transistor, obtainable by a method as hereinbefore described.

Viewed from a yet further aspect, the present invention provides an organic electronic device, e.g. a top gate thin film transistor, comprising:
i) a substrate;
ii) source and drain electrodes deposited on said substrate and having a channel region located in between them, wherein at least a part of at least one surface of each of said electrodes is coated with a surface-modifying compound;
iii) a semiconducting layer comprising a polymeric semiconductor and a non-polymeric semiconductor deposited over at least a portion of said source and drain electrodes and in said channel region;
iv) an insulating layer deposited over said semiconducting layer; and
v) a gate electrode deposited on said insulating layer,
wherein said non-polymeric semiconductor is distributed homogeneously in said semiconducting layer in the direction parallel to the surface of the electrodes coated with the surface modifying compound.

Viewed from yet another aspect the present invention provides an organic electronic device, e.g. a bottom gate thin film transistor, comprising:
i) a substrate;
ii) a gate electrode deposited on said substrate;
iii) an insulating layer deposited over said gate electrode;
iv) source and drain electrodes deposited on said insulating layer and having a channel region located in between them, wherein at least a part of at least one surface of each of said electrodes is coated with a surface modifying compound;
v) a semiconducting layer comprising a polymeric semiconductor and a non-polymeric semiconductor deposited over at least a portion of said source and drain electrodes and in said channel region;
wherein said non-polymeric semiconductor is distributed homogeneously in said semiconducting layer in the direction parallel to the surface of the electrodes coated with the surface modifying compound.

Viewed from a still further aspect, the present invention provides a blend for preparing a semiconducting layer of an organic electronic device comprising:
(i) a polymeric semiconductor;
(ii) a non-polymeric semiconductor;
(iii) a first aromatic solvent; and
(iv) a second aromatic solvent,
wherein said second aromatic solvent has a boiling point that is at least 15° C. higher than the boiling point of said first aromatic solvent.

DEFINITIONS

As used herein the term "semiconductor" refers to a compound that can act as either an electrical conductor or insulator depending upon the voltage applied to it. The term "semiconducting layer" refers to a continuous film of material that is semiconducting. The semiconducting layer formed in the present invention comprises a mixture or blend of polymeric and non-polymeric semiconductor. Preferably the polymeric semiconductor forms a matrix in which the non-polymeric semiconductor is dispersed.

As used herein the term "polymeric semiconductor" refers to polymeric compounds comprising repeating units that are semiconductors. Polymers usually have a polydispersity of greater than 1.

As used herein the term "non-polymeric semiconductor" refers to small molecule compounds that are semiconductors. The term includes dendrimeric and oligomeric compounds (e.g. dimers, trimers, tetramers and pentamers) that have a polydispersity of 1. Preferred non-polymeric semiconductors are crystalline.

As used herein the term "lateral distribution" refers to a distribution of non-polymeric semiconductor crystals which extend substantially the entire length of the channel between the source and the drain electrodes as well as over the source and drain electrodes, in a direction parallel to the surface of the electrodes.

As used herein the term "aromatic solvent" refers to solvents comprising one or more compounds that comprise a planar ring that has 4n+2 pi electrons, wherein n is a non-negative integer.

As used herein the term "boiling point" refers to the temperature at which boiling occurs at 1 atmosphere of pressure.

As used herein the term "alkyl" refers to saturated, straight chained, branched or cyclic groups. Alkyl groups may be substituted or unsubstituted.

As used herein the term "alkenyl" refers to unsaturated straight chained, branched or cyclic groups. Alkenyl groups may be substituted or unsubstituted.

As used herein the term "alkoxy" refers to O-alkyl groups, wherein alkyl is as defined above.

As used herein the term "amino" refers to primary (i.e. $NH_2$), secondary (NHR) and tertiary amino groups ($NR_2$) wherein R is alkyl as defined above.

As used herein the term "amido" refers to groups of the formulae —NHCOR and —NRCOR wherein each R, which may the same or different, is alkyl as defined above.

As used herein the term "silyl" refers to groups of the formulae -A-SiR'R''R''' wherein A is optionally present and is a saturated or unsaturated group selected from $C_{1-8}$ alkylene, $C_{1-8}$ alkenylene or $C_{1-8}$ alkynylene and each of R', R'' and R''' is H or alkyl as defined above.

As used herein the term "stannyl" refers to groups of the formulae —Sn(R')$_r$ wherein r is 1, 2 or 3 and each R' is H or alkyl as defined above.

As used herein the term "halogen" encompasses atoms selected from the group consisting of F, Cl, Br and I.

As used herein the term "aryl" includes single and multiple ring compounds, including multiple ring compounds that contain separate or fused rings. As used herein the term "heteroaryl" refers to aryl groups comprising a heteroatom selected from N, O and S. An example of an aryl group is phenyl, i.e. $C_6H_5$. Phenyl groups may be substituted or unsubstituted. An example of a heteroaryl group is thiophene, i.e. $C_4H_4S$. It may be substituted or unsubstituted. A further example is benzothiophene, which has the following structure. It may also be substituted or unsubstituted.

DESCRIPTION OF THE INVENTION

In preferred methods of the present invention, substantially all of the solvent (e.g. all of the solvent) is evaporated in the heating step. This yields a semiconducting layer comprising polymeric semiconductor and non-polymeric semiconductor. Preferably substantially no solvent (e.g. no solvent) is evaporated in the depositing step. Controlling the evaporation of solvent during deposition and heating, advantageously provides improved lateral distribution of the non-polymeric semiconductor in the semiconducting layer. Solvent evaporation during heating may be measured, for example, by using a microbalance to measure the weight of the semiconducting layer (or film) before and after heating. Solvent loss during deposition may be inferred from knowledge of the amount of solvent present and the amount lost during heating.

Deposition of the semiconducting layer is carried out from a solution comprising a non-polymeric semiconductor and a polymeric semiconductor. Any conventional solution-based processing method may be used. Representative examples of solution-based processing methods include spin coating, dip coating, slot die coating, doctor blade coating and ink-jet printing. In preferred methods of the invention, however, depositing is by spin coating. The parameters used for spin coating the semiconductor film such as spin coating speed, acceleration and time are selected on the basis of the target thickness for the semiconducting layer. Typical target thicknesses are in the range of 20 to 60 nm. Preferably the spin coating is carried out in a single phase spin. Preferably the spin speed is 300 to 1000 rpm, more preferably 400 to 900 rpm and still more preferably 500 to 750 rpm. Preferably the spin time is 5 to 180 seconds, more preferably 10 to 60 seconds and still more preferably 20 to 40 seconds. Preferably the acceleration time from rest is less than 3 seconds, preferably less than 2 seconds and still more preferably less than 1 second. Any conventional spin coating apparatus may be used. The apparatus is used in a conventional manner.

Heating of the deposited semiconducting layer is preferably carried out on a hot plate. The heating step causes the solvent present in the solution used to deposit the semiconducting layer to evaporate. Preferably the temperature of the hot plate in the heating step is 75 to 250° C., more preferably 80 to 150° C. and still more preferably 90 to 120° C. Preferably the heating time is 15 to 180 seconds, more preferably 30 to 120 seconds and still more preferably 45 to 90 seconds. Any conventional heating apparatus, e.g. hot plate, may be used. The apparatus is used in a conventional manner.

Preferably heating is carried out immediately after deposition, i.e. without any intervening steps. As explained below in more detail, the evaporation of solvent during the deposition step is suppressed and the required wet film thickness of semiconducting layer is achieved without any solvent loss. When followed by a heating step, especially a rapid heating step, this enables a semiconducting layer having a homogeneous lateral distribution of non-polymeric semiconductor in a matrix of polymeric semiconductor to be formed.

The suppression of evaporation of solvent during the deposition step is achieved by using a mixture of at least two solvents to form the solution or blend used in deposition. The solution or blend may, for example, comprise two, three or even four solvents. Preferably, however, the solution or blend comprises only two solvents. The solvents present in the solution or blend for deposition are aromatic solvents. Suitable aromatic solvents are commercially available from a range of suppliers. Anhydrous grade solvents are typically selected. Such solvents are generally able to form solutions of both polymeric and non-polymeric semiconductors.

Preferably the first aromatic solvent has a boiling point of less than 165° C. More preferably the first aromatic solvent has a boiling point of 120 to 165° C., still more preferably 130 to 155° C. and yet more preferably 140 to 150° C.

Preferably the first aromatic solvent is a $C_{1-6}$ alkyl benzene. Optionally the $C_{1-6}$ alkyl benzene is further substituted. Representative examples of further substituents include $C_{1-6}$ alkyl, $OC_{1-6}$ alkyl and $C(O)OC_{1-6}$ alkyl, preferably $C_{1-6}$ alkyl. Di-$C_{1-6}$ alkyl substituted benzenes are preferred first aromatic solvents.

Preferably the first aromatic solvent is of formula (I):

(I)

wherein
$R^1$ is selected from $C_{1-6}$ alkyl and $OC_{1-6}$ alkyl, preferably $C_{1-6}$ alkyl; and
$R^2$ and $R^3$ are each independently selected from H and $C_{1-6}$ alkyl.

In preferred solvents of formula (I) $R^1$ is $C_{1-6}$ alkyl. In further preferred solvents $R^2$ is H. In still further preferred solvents $R^3$ is $C_{1-6}$ alkyl, preferably methyl. Yet more preferably $R^1$ is $C_{1-6}$ alkyl, preferably methyl, $R^2$ is H and $R^3$ is $C_{1-6}$ alkyl.

In other preferred solvents of formula (I) $R^1$ is $OC_{1-6}$ alkyl. In further preferred solvents $R^2$ is H. In still further preferred solvents $R^3$ is H. Yet more preferably $R^1$ is $OC_{1-6}$ alkyl, preferably methyl, $R^2$ is H and $R^3$ is H.

When the first aromatic solvent is disubstituted, the substituents may be present in a [1,2], [1,3] or [1,4] substitution pattern. Preferably, however, the substituents are present in a [1,2] or ortho pattern. When the first aromatic solvent is trisubstituted, the substituents are preferably present in a [1,3,5] substitution pattern.

Preferably the first aromatic solvent is selected from the group consisting of toluene, o-xylene, m-xylene, p-xylene, anisole (or methoxybenzene) and mesitylene. These solvents have boiling points as shown in the table below. Particularly preferably the first aromatic solvent is selected from o-xylene, m-xylene or p-xylene. Still more preferably the first aromatic solvent is o-xylene.

| Solvent structure | Name | Boiling point (° C.) |
| --- | --- | --- |
|  | Toluene | 110 |
|  | o-xylene | 144 |
|  | m-xylene | 139 |

| Solvent structure | Name | Boiling point (° C.) |
|---|---|---|
| | p-xylene | 138 |
| OMe | Anisole | 155 |
| | Mesitylene | 164 |

In the method of the present invention, the second aromatic solvent preferably has a boiling point that is at least 20° C., more preferably at least 25° C. and still more preferably at least 30° C. higher than the boiling point of the first aromatic solvent. Preferably the second aromatic solvent has a boiling point of greater than 145° C., still more preferably greater than 165° C. and yet more preferably greater than 180° C. Preferably the second aromatic solvent has a boiling point of 165 to 300° C., more preferably 170 to 250° C. and still more preferably 190 to 220° C.

Preferably the second aromatic solvent is of formula (IIa) or (IIb):

IIa

IIb wherein
$R^4$ is selected from $OC_{1-6}$ alkyl or $C(O)OC_{1-6}$ alkyl;
$R^5$ and $R^6$ are each independently selected from H, $C_{1-6}$ alkyl, $OC_{1-6}$ alkyl or $C(O)OC_{1-6}$ alkyl; and
n is 1, 2 or 3.

Preferably the second aromatic solvent is of formula (IIa).

In some preferred aromatic solvents of formula (IIa), $R^4$ is $OC_{1-6}$ alkyl, particularly methoxy (OMe) or ethoxy (OEt). In further preferred solvents, $R^5$ is $C_{1-6}$ alkyl (e.g. methyl or ethyl) or $OC_{1-6}$ alkyl (e.g. methoxy or ethoxy). In still further preferred solvents $R^6$ is H. Particularly preferably $R^4$ is $OC_{1-6}$ alkyl, e.g. OMe or OEt, $R^5$ is $C_{1-6}$ alkyl, e.g. methyl or ethyl and $R^6$ is H.

In other preferred aromatic solvents $R^4$ is $C(O)OC_{1-6}$ alkyl, particularly C(O)OMe or C(O)OEt. In further preferred solvents $R^5$ is H or $C_{1-6}$ alkyl (e.g. methyl or ethyl). In still further preferred solvents $R^6$ is H. Particularly preferably $R^4$ is $C(O)OC_{1-6}$ alkyl, e.g. C(O)OMe or C(O)OEt, $R^5$ is H and $R^6$ is H.

Although second aromatic solvents of formula (IIa) are preferred, the second aromatic solvent may be of formula (IIb). In preferred solvents of formula (IIb), n is 1 or 2, particularly 2. In particularly preferred solvents, at least one of $R^5$ and $R^6$ is H. Still more preferably, both of $R^5$ and $R^6$ are H.

When the second aromatic solvent is disubstituted, the substituents may be present in a [1,2], [1,3] or [1,4] substitution pattern. Preferably, however, the substituents are present in a [1,2] or ortho pattern. When the second aromatic solvent is trisubstituted, the substituents are preferably present in a [1,3,5] substitution pattern.

Preferably the second aromatic solvent is selected from the group consisting of ethoxybenzene, 2-methylanisole, 3-methylanisole, 4-methylanisole, 1-ethoxy-2-methylbenzene, 1-ethoxy-3-methylbenzene, 1-ethoxy-4-methylbenzene, acetophenone, tetralin, 1,2-dimethoxybenzene, 1,3-dimethoxybenzene, 1,4-dimethoxybenzene, 1-methoxy-2-ethoxybenzene, 1-methoxy-3-ethoxybenzene, 1-methoxy-4-ethoxybenzene, ethyl benzoate, 1,2-diethoxybenzene, 2-methyl acetophenone, 3-methylacetophenone, 4-methylacetophenone, 2-ethylacetophenone, 3-ethylacetophenone, 4-ethylacetophenone, 1,3-diethoxybenzene, 1,4-diethoxybenzene, 2-methoxyacetophenone, 3-methoxyacetophenone, 4-methoxyacetophenone, ethyl 2-methylbenzoate, ethyl 3-methylbenzoate, ethyl 4-methylbenzoate, ethyl 2-ethylbenzoate, ethyl 3-ethylbenzoate, ethyl 4-ethylbenzoate.

Particularly preferably the second aromatic solvent is selected from the group consisting of ethoxybenzene, 2-methylanisole, 3-methylanisole, 4-methylanisole, 1-ethoxy-2-methylbenzene, 1-ethoxy-3-methylbenzene, 1-ethoxy-4-methylbenzene, acetophenone, tetralin, 1,2-dimethoxybenzene, 1,3-dimethoxybenzene, 1,4-dimethoxybenzene, 1-methoxy-2-ethoxybenzene, 1-methoxy-3-ethoxybenzene, 1-methoxy-4-ethoxybenzene, ethyl benzoate, 1,2-diethoxybenzene, 2-methyl acetophenone, 3-methyl acetophenone and 4-methyl acetophenone. Yet more preferably the second solvent is selected from 2-methylanisole, 1,3-dimethoxybenzene, ethylbenzoate and tetralin. These solvents have boiling points as shown in the table below.

| | | |
|---|---|---|
| OMe | 2-methylanisole | 170-172 |
| | tetralin | 206-208 |
| OMe ... OMe | 1,3-dimethoxybenzene | 216-217 |

| | | |
|---|---|---|
|  | ethyl benzoate | 211-213 |

Particularly preferred aromatic solvent combinations for the methods and blends of the present invention are the following:
o-xylene and 2-methylanisole;
o-xylene and 1,3-dimethoxybenzene;
o-xylene and ethylbenzoate; and
o-xylene and tetralin.

The presence of the second aromatic solvent in the solution or blend serves to suppress solvent evaporation during the deposition, e.g. spin coating, step. As a result, the removal of solvent from the semiconducting layer (and subsequent crystallisation of the non-polymeric semiconductor) solely occurs during the heating step. Solvent is removed during the heating step in a relatively short period of time of a few (e.g. <5) seconds. Due to the controlled point of semiconducting layer drying the crystallisation occurs homogeneously and the semiconducting layer has an excellent lateral distribution of non-polymeric semiconductor in a polymeric semiconductor matrix.

The methods and blends of the present invention are particularly advantageous when the semiconducting layer is deposited over source and drain electrodes that have been pre-treated with a surface modifying compound, e.g. a fluorinated benzenethiol. Such pre-treatments are carried out to reduce the contact resistance of the devices through an increase in the work function of the metal contact. A drawback of the treatment, however, is that the treated electrode surfaces tend to disrupt the lateral distribution of the non-polymeric semiconductor when the semiconducting layer drying is characterised by a slow process (e.g. when a significant proportion of the solvent evaporates during the deposition step). Crystal nucleation centres tend to be concentrated in the region of the treated electrode surfaces and, if significant crystal growth occurs, large scale segregation can occur. Significant crystal growth can occur perpendicularly to the surface of the treated electrodes and can even protrude from the upper surface of the semiconducting layer. The concentration of crystals in one area inevitably means there is a deficiency of crystals from other areas. Thus the overall result is isolated domains of crystalline non-polymeric semiconductor embedded in a polymeric semiconductor overlaying the electrodes and reduced lateral coverage of crystals in the channel region.

This problem is, however, avoided using the methods and blends of the present invention. By suppressing solvent evaporation and therefore crystallisation during the deposition step there is much less time for the non-polymeric semiconductor to crystallise at the nucleation centres and for segregated domains to form. Instead crystallisation occurs rapidly and homogeneously during the heating step and thereby extends over both of the source and drain electrodes as well as the channel region. As a result devices comprising the semiconducting layer have high mobilities and low contact resistance.

There is preferably a greater amount of first aromatic solvent to second aromatic solvent in the solution or blend since this facilitates evaporation of the solvent during the heating step. The amount of second aromatic solvent is preferably the minimum necessary to prevent any solvent evaporation occurring during the deposition step. Preferably the weight ratio of the first aromatic solvent to the second aromatic solvent in the solution or blend for deposition is in the range 60:40 to 99:1, more preferably 70:30 to 95:5 and still more preferably 80:20 to 90:10.

The polymeric semiconductor present in the solution or blend for deposition may be any known polymeric semiconductor suitable for processing from solution. Examples of polymeric semiconductors known to the skilled person are described in prior art such as Smith et. al., Applied Physics Letters, Vol 93, 253301 (2008); Russell et. al., Applied Physics Letters, Vol 87, 222109 (2005); Ohe et. al., Applied Physics Letters, Vol 93, 053303 (2008); Madec et. al., Journal of Surface Science & Nanotechnology, Vol 7, 455-458 (2009); and Kang et. al., J. Am. Chem. Soc., Vol 130, 12273-75 (2008).

Suitable polymeric semiconductors are commercially available.

Preferably the polymeric semiconductor is a conjugated polymer. Preferably the polymeric semiconductor comprises a repeat unit of formula (IIIa)

(IIIa)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms.

Examples of alkyl groups include methyl, ethyl, propyl, butyl, pentyl, hexyl, heptyl, octyl, nonyl or decyl. Examples of aryl groups include phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkoxy groups include methoxy, ethoxy, propoxy, isopropoxy and butoxy.

In preferred polymeric semiconductors $R^1$ and $R^2$ are the same.

Preferred polymeric semiconductors comprise a repeat unit of formula (IIIa) wherein, wherein $R^1$ and $R^2$ are each selected from the group consisting of hydrogen, an alkyl group having from 1 to 12 carbon atoms and a phenyl group, said phenyl group being unsubstituted or substituted with one or more substituents selected from an alkyl group having from 1 to 12 carbon atoms and an alkoxy group having from 1 to 12 carbon atoms. Still more preferred polymeric semiconductors comprise a repeat unit of formula (IIIa) wherein $R^1$ and $R^2$ are each selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms. Yet further preferred polymeric semiconductors comprise a repeat unit of formula (IIIa) wherein $R^1$ and $R^2$ are each selected from the group consisting of an alkyl group having from 4 to 12 carbon atoms, preferably butyl, pentyl, hexyl, heptyl, octyl, nonyl or decyl, particularly octyl, e.g. n-ocytyl.

Further preferred semiconducting polymers comprise a repeat unit of formula (IIIb):

(IIIb)

wherein $Ar^1$ and $Ar^2$ are the same or different and each is selected from an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;

$R^3$ is an alkyl group having from 1 to 8 carbon atoms or a phenyl group which may be unsubstituted or substituted with an alkyl group having from 1 to 8 carbon atoms; and n is an integer greater than or equal to 1, preferably 1 or 2.

Examples of aryl groups include phenyl, indenyl, naphthyl, phenanthrenyl and anthracenyl groups. Examples of 5- to 7-membered heteroaryl groups include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy.

In preferred polymeric semiconductors comprising a repeat unit of formula (IIIb) $Ar^1$ and $Ar^2$ are the same. Particularly preferably each of $Ar^1$ and $Ar^2$ is a phenyl group, preferably an unsubstituted phenyl group.

In further preferred polymeric semiconductors comprising a repeat unit of formula (IIIb) $R^3$ is an alkyl group having from 1 to 8 carbon atoms or a phenyl group which may be unsubstituted or substituted with an alkyl group having from 1 to 8 carbon atoms. Particularly preferably $R^3$ is alkyl group, especially an alkyl group comprising 2 to 5 carbon atoms, e.g. ethyl, propyl, butyl, pentyl. Still more preferably $R^3$ is a phenyl group substituted with an alkyl group having from 1 to 8 carbon atoms, e. g. ethyl, propyl, butyl, pentyl.

Still more preferably the polymeric semiconductor present in the solution or blend for deposition comprises a repeat unit of formula (IIIa) and a repeat unit of formula (IIIb). Preferably the ratio of repeat unit of formula (I) to formula (II) is in the range 3:1 to 1:3, more preferably 2:1 to 1:2 and still more preferably about 1:1. Particularly preferably the polymeric semiconductor comprises a repeat unit of formula (IIIc):

(IIIc)

wherein $R^1$, $R^2$, $Ar^1$, $Ar^2$ and $R^3$ are as defined above in relation to formulae (IIIa) and (IIIb).

Yet more preferably the polymeric semiconductor is TFB [9,9'-dioctylfluorene-co-N-(4-butylphenyl)-diphenylamine] n, wherein n is greater than 100.

The non-polymeric semiconductor present in the solution or blend for deposition may be any small molecule semiconductor suitable for the purpose, e.g. those known to the skilled person skilled as described in the prior such as those small molecule semiconductors described in WO2010/061176. Suitable non-polymeric semiconductors are commercially available. Typical examples include pentacene derivatives and thiophene derivatives Preferably the non-polymeric semiconductor is a compound comprising a core of at least three fused rings wherein each ring is independently selected from aromatic rings and heteroaromatic rings that are each individually unsubstituted or substituted with one or more substituents. Exemplary substituents include $C_{1-12}$ alkyl groups, $C_{1-12}$ alkoxy groups, halogens (e.g. F), or silyl groups including trialkylsilyl and trialkylsilylethynyl.

Preferably the non-polymeric semiconductor is a benzothiophene derivative and more preferably a benzothiophene derivative of formula (IV):

(IV)

wherein A is a phenyl group or a thiophene group, said phenyl group or thiophene group optionally being fused with a phenyl group or a thiophene group which can be unsubstituted or substituted with at least one group of formula $X^1$ and/or fused with a group selected from a phenyl group, a thiophene group and a benzothiophene group, any of said phenyl, thiophene and benzothiophene groups being unsubstituted or substituted with at least one group of formula $X^1$; and each group $X^1$ may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups, unsubstituted or substituted alkenyl groups having from 2 to 12 carbon atoms and unsubstituted or substituted alkynyl groups having from 2 to 12 carbon atoms, or (ii) a polymerisable or reactive group selected from the group consisting of halogens, boronic acids, diboronic acids and esters of boronic acids and diboronic acids, alkenyl groups having from 2 to 12 carbon atoms and stannyl groups.

Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy. Examples of amino groups include amino, methylamino, ethylamino and methylethylamino. Examples of silyl groups include trialkylsilyl and trialkylsilylethynyl. Examples of alkenyl groups include ethenyl, propenyl and 2-methylpropenyl.

Possible substituents on the afore-mentioned $X^1$ groups include alkoxy groups having from 1 to 12 carbon atoms, halogen atoms, amino groups that may be unsubstituted or substituted with one or two alkyl groups that may be the same or different and each having from 1 to 8 carbon atoms, acylamino groups having from 2 to 12 carbon atoms, nitro groups, alkoxycarbonyl groups having from 2 to 7 carbon atoms, carboxyl groups, aryl groups having from 5 to 14 carbon atoms and 5- to 7-membered heteroaryl groups containing from 1 to 3 sulfur atoms, oxygen atoms, selenium atoms and/or nitrogen atoms.

In preferred benzothiophene derivatives of formula (IV) A is selected from:

a thiophene group that is fused with a phenyl group substituted with at least one group of formula $X^1$; or a phenyl group that may be unsubstituted or substituted with at least one group of formula $X^1$, said phenyl group further optionally being fused with a thiophene group which can be unsubstituted or substituted with at least one group of formula $X^1$ and/or fused with a benzothiophene group, said benzothiphene group being unsubstituted or substituted with at least one group of formula $X^1$.

In particularly preferred benzothiophene derivatives A is a thiophene group that is fused with a phenyl group substituted with at least one group of formula $X^1$.

In preferred benzothiophene deriatives each $X^1$ is the same. Particularly preferably $X^1$ is selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms. Still more preferably $X^1$ is selected from the group consisting of unsubstituted or substituted straight, branched or cyclic alkyl groups having from 1 to 20 carbon atoms. Yet more preferably $X^1$ is a group of formula $C_nH_{2n+1}$ wherein n is 0 or an integer of from 1 to 16, more preferably from 4 to 16.

Examples of preferred non-polymeric semiconductors are shown below:

(IVa)

(IVb)

(IVc)

(IVd)

wherein $X^1$ is as defined above in relation to formulae (IV). More preferably the non-polymeric semiconductor is of formula (IVa). Yet more preferably the non-polymeric semiconductor is:

Alternatively the non-polymeric semiconductor is a pentacene derivative, more preferably a pentacene derivative of formula (V):

(V)

wherein each Z may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups, unsubstituted or substituted alkenyl groups having from 2 to 12 carbon atoms and unsubstituted or substituted alkynyl groups having from 2 to 12 carbon atoms; (ii) a polymerisable or reactive group selected from the group consisting of boronic acids, diboronic acids and esters of boronic acids and diboronic acids, alkenyl groups having from 2 to 12 carbon atoms and stannyl groups; (iii) a halogen (e.g. F) or (iv) H, with the proviso that at least one Z is not H.

Examples of alkyl groups include methyl, ethyl, propyl, butyl, pentyl, hexyl, heptyl, octyl, nonyl or decyl. Examples of alkoxy groups include methoxy, ethoxy, propoxy, isopropoxy and butoxy. Examples of amino groups include amino, methylamino, ethylamino and methylethylamino. Examples of silyl groups include trialkylsilyl and trialkylsilylethynyl. Examples of alkenyl groups include ethenyl, propenyl and 2-methylpropenyl.

In preferred pentacene derivatives of formula (V) each Z may be the same or different and is selected from the group consisting of silyl groups, a halogen (e.g. F) or H, with the proviso that at least one Z is not H.

In preferred pentacene derivatives at least two Z groups are not H. Particularly preferably two Z groups are not H.

An example of a preferred pentacene derivative is TIPS pentacene:

Preferably the weight ratio of the polymeric to non-polymeric semiconductor in the semiconducting layer is in the range 60:40 to 90:10, more preferably 70:30 to 85:15 and still more preferably about 75:25. The solution or blend for deposition preferably comprises 0.5 to 10% wt/v semiconductor (i.e. polymeric and non-polymeric semiconductor), still more preferably 0.6 to 7.5% wt/v semiconductor and yet more preferably 1 to 5% wt/v semiconductor. Preferably the solution or blend for deposition preferably comprises 0.6-4.5% wt/v polymeric semiconductor and more preferably 0.75-3.75% wt/v polymeric semiconductor. Preferably the solution or blend for deposition preferably comprises 0.1-2% wt/v non-polymeric semiconductor and more preferably 0.15-1.00% wt/v non-polymeric semiconductor.

In the methods of the present invention the solution or blend is deposited over at least a portion of source and drain electrodes and in a channel region located in between the electrodes. Optionally the method of the invention comprises a prior step of binding a silane or a silazane to the surface of the channel region prior to deposition. When present, silane or silazane is preferably in the form of a self-assembled monolayer (SAM). Representative examples of suitable silanes include trichlorosilane substituted with a hydrocarbyl group selected from $C_{1-20}$ alkyl, phenyl and phenyl-$C_{1-20}$ alkyl. Representative examples of suitable silazanes include hexamethyldisilazane) (also known as Bis(trimethylsilyl)amine or HMDS).

In preferred methods of the invention at least a part of one surface, more preferably at least one surface, of each of the electrodes is coated with a surface-modifying compound. Preferred surface-modifying compounds form a self-assembled monolayer (SAM). The surface modifying compound preferably reduces contact resistance between the semiconductors and the electrodes by altering the work function of the source and drain electrodes.

Preferably the surface-modifying material is of formula (VI)

$$\text{Bind-(Sp)}_z\text{-Org} \qquad (VI)$$

wherein
Bind is a binding group, preferably a thiol;
Sp is a spacer group, preferably a $C_{1-12}$ alkyl or $C_{6-10}$ aryl group;
z is 0 or 1, preferably 0; and
Org is a conjugated organic group, preferably phenyl substituted by one or more fluorine atoms.

The surface-modifying compound is preferably a fluorinated benzenethiol. Representative examples of suitable compounds include pentafluorobenzenethiol. The surface-modifying compound may be applied to the electrodes using any conventional method known in the art.

As described above, the presence of a surface-modifying compound such as a fluorinated benzenethiol on a surface of the electrodes would normally lead to segregation of crystals of non-polymeric semiconductor during solvent evaporation. The methods and blends of the present invention, however, overcome this problem. Thus in preferred methods of the present invention, after evaporation of the solvent in the heating step is completed, the non-polymeric semiconductor is distributed homogeneously in the semiconducting layer in the direction parallel to the modified surface of the electrodes.

The methods of the present invention provide semiconducting layers with high charge carrier mobility. The semiconducting layer preferably has a thickness of 20 to 80 nm and more preferably 30 to 60 nm.

The semiconducting layer may be incorporated into any organic electronic device that benefits from improved mobility. Preferably, however, the organic electronic device is an organic thin film transistor. The transistors can be p-type or n-type. Suitable transistor configurations include top-gate transistors and bottom-gate transistors.

A preferred example of the method of the present invention is a method of making an organic thin film transistor comprising a substrate, source and drain electrodes having a channel region located in between them, a semiconducting layer extending across the channel region and in electrical contact with the source and drain electrodes, a gate electrode and an insulating layer between the gate electrode and the semiconducting layer, wherein the semiconducting layer is deposited by a method as hereinbefore defined.

In one preferred method the transistor is a top gate transistor. In such methods the source and drain electrodes having a channel region located in between them are preferably deposited on a substrate, and the semiconducting layer is deposited over at least a portion of the source and drain electrodes and in said channel region. Preferably at least a part of one surface, more preferably at least one surface, of each of the electrodes is pre-coated with a surface-modifying compound as described above. Preferably the method further comprises depositing an insulating layer on the surface of the semiconducting layer. Still more preferably the method further comprises depositing a gate electrode on the insulating layer.

A preferred method of making a top gate thin film transistor therefore comprises:
(i) depositing source and drain electrodes having a channel region located in between them on a substrate;
(ii) optionally treating at least a part of at least one surface of said electrodes with a surface-modifying compound;
(iii) depositing a semiconducting layer over at least a portion of the source and drain electrodes and in said channel region according to the method hereinbefore described;

(iv) depositing an insulating layer on the surface of the semiconducting layer; and
(v) depositing a gate electrode on the insulating layer.

In another preferred method the transistor is a bottom gate transistor. In such methods the source and drain electrodes having a channel region located in between them are deposited on a substrate on which a gate electrode and an insulating layer have already been deposited, and the semiconducting layer is deposited over at least a portion of the source and drain electrodes and in the channel region. Preferably at least a part of at least one surface, more preferably at least one surface, of each of the electrodes is coated with a surface-modifying compound as described above.

A preferred method of making a bottom gate thin film transistor therefore comprises:
(i) depositing a gate electrode on a substrate;
(ii) depositing an insulating layer on the surface of the gate electrode;
(iii) depositing source and drain electrodes having a channel region located in between them on the insulating layer;
(iv) optionally treating at least a part of at least one surface of said electrodes with a surface-modifying compound; and
(v) depositing a semiconducting layer over at least a portion of the source and drain electrodes and in said channel region according to the method hereinbefore described.

The electrodes (source, drain and gate) are preferably deposited by thermal evaporation. The electrodes are preferably 20 to 300 nm thick and more preferably 40 to 250 nm. The insulating layer is preferably deposited by spin coating. The insulating layer is preferably 10 to 2000 nm thick and more preferably 300 to 400 nm. The surface-modifying compound is preferably deposited by immersion.

The substrate may be any material conventionally used in the art such as glass or plastic (e.g. of PEN or PET type). Optionally the substrate is pre-treated to improve adhesion thereto.

The source, drain and gate electrodes may be selected from a wide range of conducting materials. Representative examples include a metal (e.g. chromium, titanium, gold, aluminium, silver, copper, nickel), a metal alloy, a metal compound (e.g. indium tin oxide) or a conductive polymer. Preferably the source, drain and gate electrodes are metal. More preferably the source and drain electrodes are Cr/Au. More preferably the gate electrode is Al.

The insulating layer is preferably a dielectric. Any conventional dielectric may be used. Representative examples of suitable dielectrics include polytetrafluoroethylene (PTFE), perfluoro cyclo oxyaliphatic polymer (CYTOP), perfluoroalkoxy polymer resin (PFA), fluorinated ethylenepropylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez (RTM) or Tecnoflon (RTM), fluoro elastomers such as Viton (RTM), perfluoropolyether (PFPE) and a polymer of tetrafluoroethylene, hexafluoropropylene and vinylidene fluoride (THV). Fluorinated polymers are an attractive choice for the dielectric, particularly in the field of organic thin film transistors (OTFTs), because they possess a number of favourable properties including: (i) excellent spin coating properties, for instance: (a) wetting on a wide variety of surfaces; and (b) film formation, with the option of doing multi-layer coatings; (ii) chemical inertness; (iii) quasi-total solvent orthogonality: consequently, the risk of the organic semiconductor being dissolved by the solvent used for spin-coating the dielectric is minimal; and (iv) high hydrophobicity: this can be advantageous because it results in low water uptake and low mobility of ionic contaminants in the fluorinated polymer dielectric (low hysteresis).

Preferred devices of the present invention have one or more of the following structural characteristics:
Substrate: Glass surface with chrome adhesion layer
Source and drain electrodes: Gold
Source and drain electrode thickness: 5 to 200 nm
Electrode SAM: pentafluorobenzenethiol
SAM thickness: less than 10 nm
Channel length: less than 20 microns
Semiconducting layer thickness: 60 to 60 nm
Insulating layer: PTFE
Insulating layer thickness: 50 to 500 nm
Gate electrode: Aluminium
Gate electrode thickness: 20 to 300 nm Organic devices obtainable by the method of the invention are characterised by the lateral distribution of non-polymeric semiconductor in the semiconducting layer. In particular the non-polymeric semiconductor is distributed homogeneously in the semiconducting layer in the direction parallel to the surface of the electrodes and in particular to the surface treated with surface modifying compound. This is achieved by the methods of the present invention wherein solvent evaporation is suppressed during deposition and then carried out rapidly by a heating step. This minimises or prevents vertical crystal growth in the semiconducting layer thus improved homogeneity is achieved in the lateral direction.

The improved lateral distribution of non-polymeric semiconductor in the semiconducting layer manifests itself in reduced contact resistance, particularly for short channel length devices (<20 μm). In short channel length devices contact resistance can contribute a significant proportion to the total channel resistance in the device. The higher the contact resistance in the device, the higher the proportion of the applied voltage is dropped across the source and drain contacts and, as a result, the lower the bias across the channel region is achieved. A high contact resistance has the effect of a much lower current level being extracted from the device due to the lower bias applied across the channel region, and hence lower device mobility.

Preferably the saturation mobility ($cm^2/Vs$) of a top gate, bottom, contact thin film transistor having a channel length of 20 microns and comprising a semiconducting layer prepared by the method of the invention is at least 3 times, more preferably at least 4 times and still more preferably at least 5 times greater than the mobility of an identical transistor comprising a semiconducting layer prepared using only o-xylene as the solvent. More preferably the saturation mobility ($cm^2/Vs$) of a top gate, bottom contact thin film transistor having a channel length of 50 microns and comprising a semiconducting layer prepared by the method of the invention is at least 2 times, more preferably at least 3 times and still more preferably at least 4 times greater than the mobility of an identical transistor comprising a semiconducting layer prepared using only o-xylene as the solvent.

DETAILED DESCRIPTION OF THE INVENTION

Figure 1:
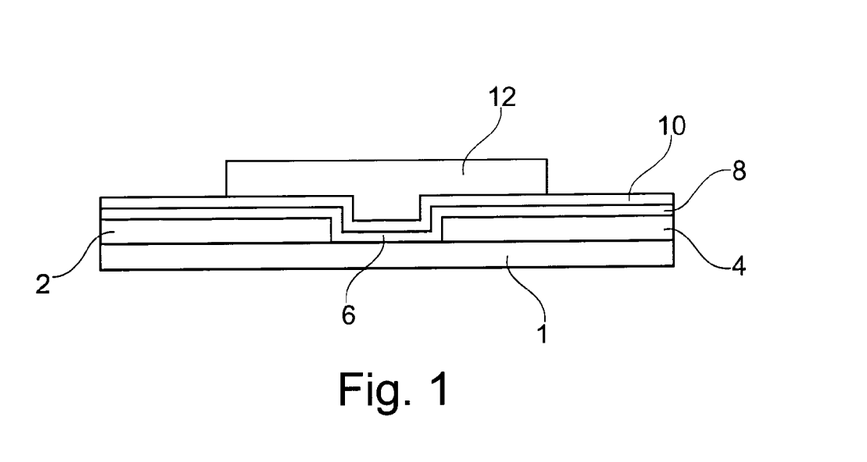
FIG. 1 is a schematic of a typical top gate thin film transistor.

Referring to FIG. 1, it shows a schematic of a top gate thin film transistor. The structure may be deposited on a substrate 1 and comprises source and drain electrodes 2, 4 which are spaced apart with a channel region 6 located therebetween. An organic semiconductor 8 is deposited in the channel region 6 and may extend over at least a portion of the source and drain electrodes 2, 4. An insulating layer 10 of dielectric material is deposited over the organic semiconductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

Figure 2:
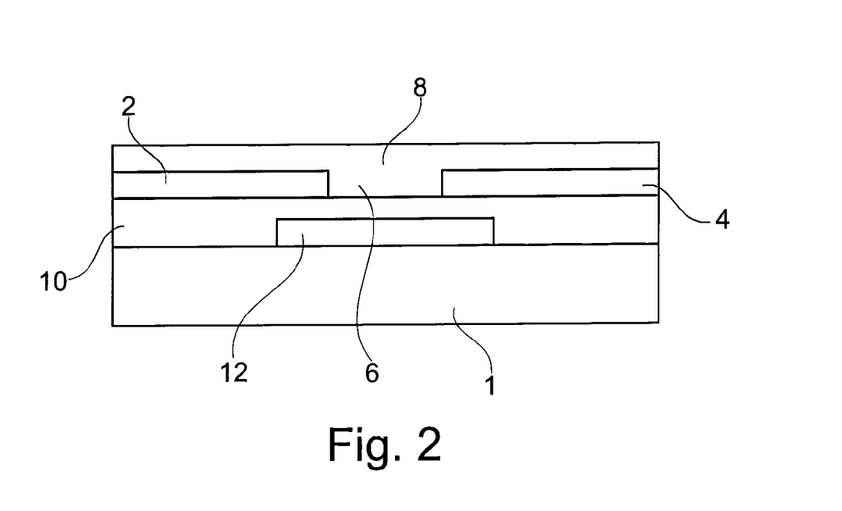
FIG. 2 is a schematic of a typical bottom gate thin film transistor.

FIG. 2 shows a schematic of a bottom gate thin film transistor. In FIG. 2 like reference numerals have been used for corresponding parts to FIG. 1. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel of the transistors can be altered by the application of a voltage at the gate. In this way the transistor can be switched on and off using an applied gate voltage. The drain current that is achievable for a given voltage is dependent on the mobility of the charge carriers in the channel region between the source and drain electrodes. Thus, in order to achieve high drain currents with low operational voltages, organic thin film transistors must have an organic semiconductor which has highly mobile charge carriers in the channel region.

Figure 3A:
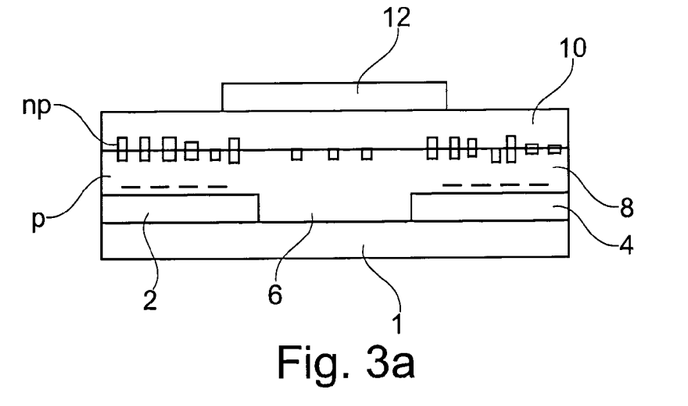
FIG. 3a is a schematic of a top gate thin film transistor prepared according to conventional methods showing the distribution of non-polymeric semiconductor in the semiconducting layer.
Figure 3B:
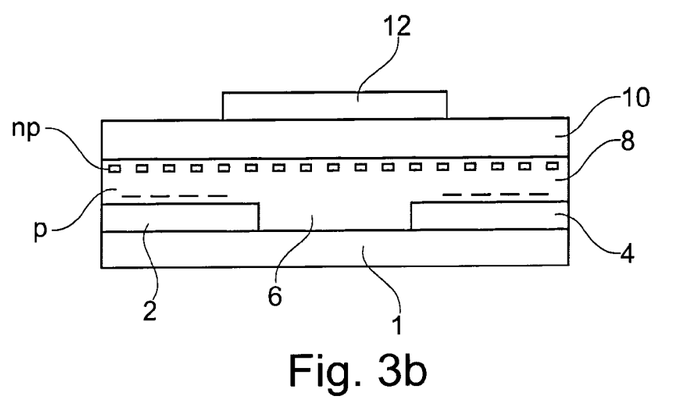
FIG. 3b is a schematic of a top gate thin film transistor prepared according to the method of the invention showing the distribution of non-polymeric semiconductor in the semiconducting layer.

FIGS. 3a and 3b show schematic diagrams of top gate thin film transistors prepared according to the prior art and by the method of the invention respectively. The same reference numerals are used as in FIGS. 1 and 2. During spinning the non-polymeric semiconductor tends to migrate towards the upper surface of the polymeric semiconductor matrix. In the on-state of the transistor, charge accumulation occurs in this region. The semiconducting layer is therefore non-homogeneous in the direction perpendicular to the modified surface of the electrodes (shown as ----) with more non-polymer semiconductor crystals being present in the uppermost region adjacent to the insulating layer. As shown in FIGS. 3a and 3b, however, the use of a second aromatic solvent having a higher boiling point during deposition of the semiconducting layer increases the lateral uniformity of the distribution of non-polymeric semiconductor in the semiconducting layer compared to the use of a solvent such as o-xylene alone.

When a solution comprising polymeric semiconductor (p), non-polymeric semiconductor (np) and o-xylene is deposited onto a substrate, crystallisation of the non-polymeric semiconductor begins during the deposition step due to the evaporation of some of the o-xylene. Thus a number of nucleation sites form, but are generally concentrated in the vicinity of the electrodes, particularly if surface modification of the electrodes has been carried out. Since nucleation and crystallisation occurs early on in deposition, significant crystal growth occurs prior to the completion of drying. The non-polymeric semiconductor tends to crystallise in a vertical direction, resulting in a semiconducting layer of non-uniform thickness and in which non-polymeric semiconductor is not uniformly distributed across the channel or the electrodes. Typically the non-polymeric semiconductor will be concentrated in regions above the electrodes and absent from the channel region. This means that polymeric semiconductor must transport the charge carriers for current to flow. This reduces the mobility of the semiconductor layer since the crystalline non-polymeric semiconductor has much higher mobility and increases the contact resistance of the device in which it is present.

In the methods of the present invention, the presence of the second aromatic solvent serves to prevent any crystallisation occurring during the deposition step. This is achieved by the second, higher boiling point, aromatic solvent preventing evaporation of any solvent occurring during the deposition step. As a result the non-polymeric semiconductor is maintained in solution during deposition. Nucleation and crystallisation does not begin until heating is carried out to evaporate the solvent. Since heating is carried out at an elevated temperature, however, evaporation occurs quickly and vertical crystal growth is avoided. Consequently the resulting crystals of non-polymeric semiconductor extend substantially the entire length of the channel between the source and drain electrodes as well as over the source and drain electrodes. This is described as homogeneous lateral distribution.

EXAMPLES

Materials
o-Xylene, 2-methylanisole, 1,3-dimethoxybenzene, ethylbenzoate and tetralin were obtained from Sigma-Aldrich.
Preparative Example for the Fabrication of Organic Thin Film Transistors
(i) Pre-Cleaning of OTFT Substrates and Self-Assembled Monolayer (SAM) Pre-Treatments:
The first step in fabrication of the device required the pre-cleaning of the device substrates and the application of self-assembled monolayer materials on the source and drain electrodes in order to ensure that the contact resistance is minimised. The substrates consist of gold source and drain electrodes on top of a chrome adhesion layer on the glass surface (5/40 nm Cr/Au). The substrates were cleaned by oxygen plasma to ensure any residual photoresist material (used for the source-drain electrode definition) is removed.

After the plasma treatment, an electrode SAM (pentafluorobenzenethiol) was applied from a solution in isopropanol at a concentration of 50 mM by flooding the substrate in the isopropanol solution for a period of 2 minutes. The solution was removed by spinning the substrate on a spin coater, then rinsing it in isopropanol to remove any unreacted material from the substrate. All of these steps were performed in air. Samples were then transported to a dry nitrogen environment and baked at 60° C. for 10 minutes to ensure the samples were dehydrated.

(ii) Preparation and Spin-Coating of the Semiconductor Blend Material Solution:

The blends of non-polymeric semiconductors and polymeric semiconductor were prepared as a solution in a solvent mixture comprising o-xylene and one other solvent selected from 2-methylanisole, 1,3-dimethoxybenzene, ethylbenzoate and tetralin (see Table below). The mixture of solvents is based on volume ratios. The blends were prepared either by mixing individual solutions by volume in which each component was prepared in the solvent mixture, or by making a single solution of the desired concentration from the pre-weighed mixture of non-polymeric and polymeric semiconductors and the solvent mixture. The blend was prepared to a concentration of 1.2% w/v (12 mg solid per 1 ml of solvent mixture).

The polymeric semiconductor was TFB as disclosed above and in WO 2010/084977 and the non-polymeric semiconductor was as shown below and prepared in accordance with the methods disclosed in WO 2011/004869):

Deposition of this blend was made using a spin coater at a coating speed of 600 rpm for a period of 30 seconds. A single phase spin was used. The resulting wet film was then dried on a hot plate at 100° C. for a period of 1 minute. The thickness of the layer was 55 nm.

| Solvent structure | Name | Boiling point (° C.) |
|---|---|---|
| o-xylene | o-xylene | 144 |
| OMe | 2-methylanisole | 170-172 |
| 1,3-dimethoxybenzene | 1,3-dimethoxybenzne | 216-217 |
| ethyl benzoate | ethyl benzoate | 211-213 |
| tetralin | tetralin | 206-208 |

(iii) Deposition of the Dielectric Layer:

A dielectric layer was then deposited by spin coating a solution of PTFE on this semiconductor film. The thickness of the dielectric layer was 350 nm.

(iv) Deposition of the Gate Electrode:

Finally the gate electrode was deposited by thermal evaporation of 250 nm aluminium through a shadow mask to give the desired top-gate organic thin film transistor.

Figure 5:
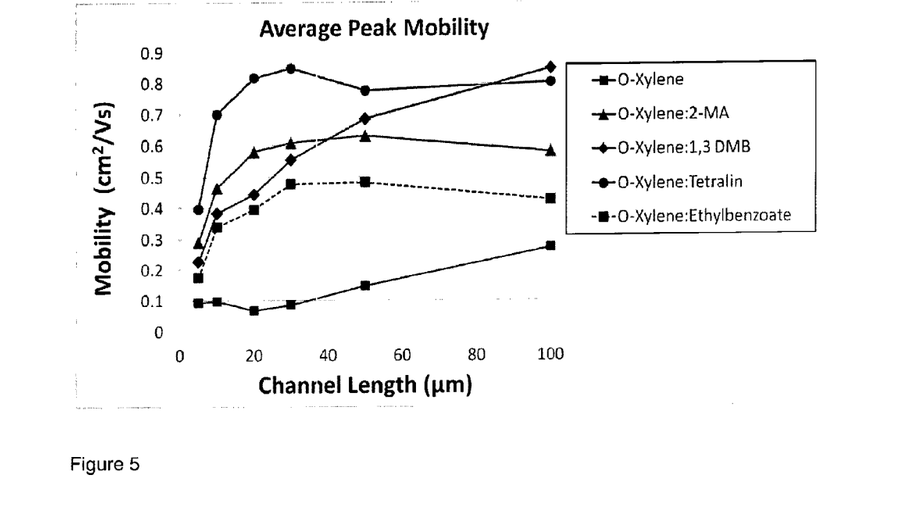
FIG. 5 shows a plot of saturation mobility ($cm^2/Vs$) obtained for top gate, bottom contact thin film transistors with a semiconducting layer prepared by conventional methods and prepared by a method of the present invention.

(iv) Device Characterisation:

AFM was carried out using a Veeco Nanoscope apparatus. Devices produced as described above were measured in ambient conditions (no device encapsulation was used) using a Hewlett Packard 4156C semiconductor parameter analyser by measuring output and transfer device characteristics. Device mobility was calculated from the transfer data in the saturation regime. The saturation mobility as shown in FIG. 5 discussed below refers to the saturation regime mobility, where the drain electrode is biased at −40V with reference to the source electrode. In this regime, the drain current is said to be "saturated" with respect to the drain bias, such that a higher drain bias does not result in a higher drain current. Furthermore, the mobility is a measure of how much current is delivered through the device, and it does not necessarily refer to the intrinsic mobility of the semiconductor material itself (although in many instances this is true). For example, a device with the same mobility of material in the channel region may exhibit a higher contact resistance as compared to another device, therefore exhibiting a lower "device" mobility.

Example 1

In this first example, atomic force microscopy images were taken of devices prepared as described in the above preparative example with a semiconducting layer deposited from either o-xylene alone (as a comparative example) or from solvent mixtures comprising o-xylene and one of either 2-methylanisole, 1,3-dimethoxybenzene or ethylbenzoate.

Figure 4A:
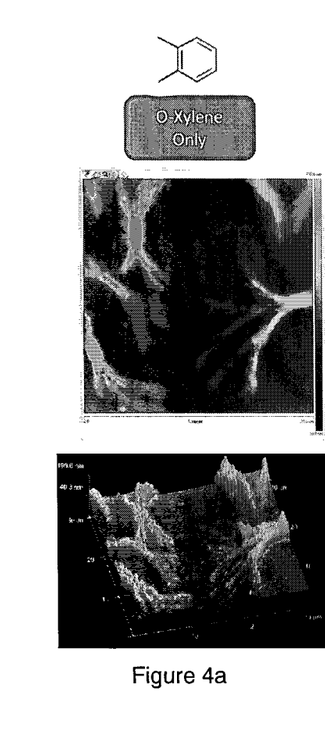
FIG. 4a shows 2D and 3D plots of an atomic force microscopy (AFM) image (height data) of a semiconductor layer prepared according to conventional methods using o-xylene.

The use of o-xylene alone results in solvent evaporation taking place during the deposition of the semiconducting layer. This results in a device in which isolated domains of the non-polymeric semiconductor embedded in the polymer matrix, as can be seen in FIG. 4a (top figure). The 3D AFM (height data) analysis highlights that the channel region of the device mostly comprises the polymeric semiconductor (FIG. 4a, bottom figure), leading to a low mobility device.

Figure 4B:
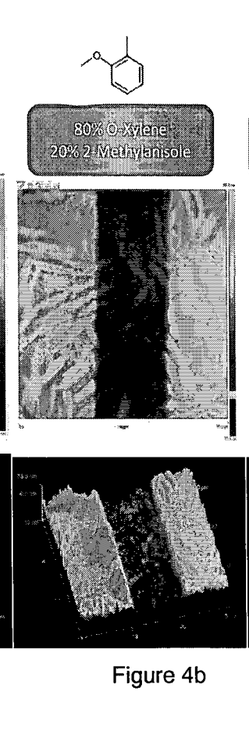
FIG. 4b shows 2D and 3D plots of an AFM image (height data) of a semiconductor layer prepared according to the method of the invention using o-xylene and 2-methylanisole.
Figure 4C:
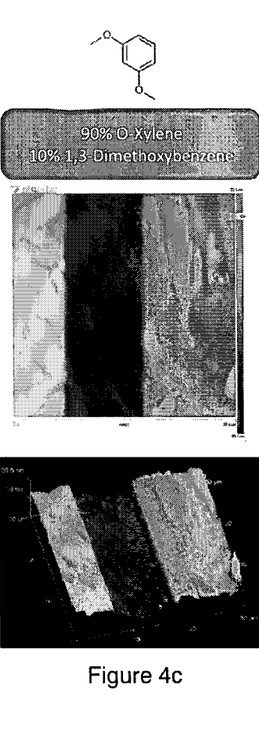
FIG. 4c shows 2D and 3D plots of an AFM image (height data) of a semiconductor layer prepared according to the method of the invention using o-xylene and 1,3 dimethoxybenzene.
Figure 4D:
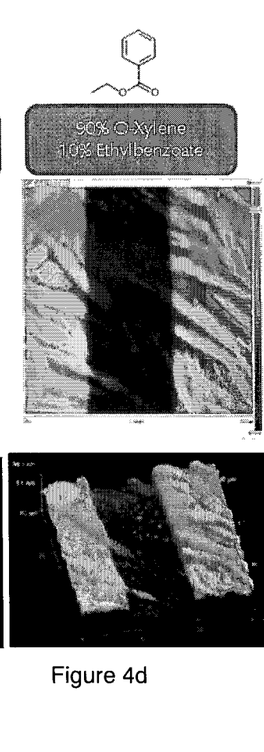
FIG. 4d shows 2D and 3D plots of an AFM image (height data) of a semiconductor layer prepared according to the method of the invention using o-xylene and ethylbenzoate.

In comparison, it can be seen in FIGS. 4b, 4c and 4d that in devices in which the semiconducting layer was deposited from a solution of o-xylene and one other higher boiling aromatic solvent, improved non-polymeric semiconductor crystal coverage is achieved laterally across the film.

Example 2

Mobility data for devices with semiconducting layers deposited from either o-xylene alone or from o-xylene with a higher boiling solvent is shown in FIG. 5. Average peak mobility (in $cm^2/Vs$) was measured at a range of channel lengths used in the test cells (5 to 100 μm). Devices with the shortest channel lengths were generally found to exhibit lower mobilities (contact resistance is the more dominant component compared to the total channel resistance) and vice versa.

The use of o-xylene in combination with a second higher boiling point aromatic solvent (in these examples, 2-methylanisole, tetralin, ethylbenzoate and 1,3-dimethoxybenzene) very clearly highlights the improvement in device performance, with those devices exhibiting mobilities of upwards of around 0.2 to 0.8 $cm^2/Vs$ for all channel lengths tested. In comparison, in the device in which o-xylene alone was used, mobilities of between 0.1 and 0.3 $cm^2/Vs$ were measured, with a mobility of greater than 0.2 $cm^2/Vs$ only being observed with a 100 μm channel length.

The invention claimed is:

1. A method for preparing a semiconducting layer of an organic electronic device comprising:
   (i) depositing said semiconducting layer from a solution comprising a polymeric semiconductor, a non-polymeric semiconductor, a first aromatic solvent and a second aromatic solvent, wherein said second aromatic solvent has a boiling point that is at least 15° C. higher than the boiling point of said first aromatic solvent, wherein said solution is deposited over at least a portion of source and drain electrodes and in a channel region located in between said electrodes; and
   (ii) heating said deposited layer to evaporate said first aromatic solvent and/or said second aromatic solvent.

2. The method as claimed in claim 1, wherein substantially all of the first aromatic solvent and/or said second aromatic solvent is evaporated in said heating step, and/or wherein substantially no solvent is evaporated in said depositing step.

3. The method as claimed in claim 1, wherein said first aromatic solvent has a boiling point of 120 to 165° C.

4. The method as claimed in claim 1, wherein said first aromatic solvent is of formula (I):

(I)

wherein
$R^1$ is selected from $C_{1-6}$ alkyl and $OC_{1-6}$ alkyl; and
$R^2$ and $R^3$ are each independently selected from H and $C_{1-6}$ alkyl.

5. The method as claimed in claim 1, wherein said first aromatic solvent is selected from the group consisting of toluene, o-xylene, m-xylene, p-xylene, methoxybenzene and mesitylene.

6. The method as claimed in claim 1, wherein said second aromatic solvent is of formula (IIa) or (IIb):

wherein
$R^4$ is selected from $OC_{1-6}$ alkyl or $C(O)OC_{1-6}$ alkyl;
$R^5$ and $R^6$ are each independently selected from H, $C_{1-6}$ alkyl, $OC_{1-6}$ alkyl or $C(O)OC_{1-6}$ alkyl; and
n is 1, 2 or 3.

7. The method as claimed in claim 6, wherein:
the second aromatic solvent is of formula (IIa);
$R^4$ is $OC_{1-6}$ alkyl;
$R^5$ is $C_{1-6}$ alkyl or $OC_{1-6}$ alkyl; and/or,
$R^6$ is H.

8. The method as claimed in claim 6, wherein:
the second aromatic solvent is of formula (IIa);
$R^4$ is $C(O)OC_{1-6}$ alkyl;
$R^5$ is H or $C_{1-6}$ alkyl; and/or,
$R^6$ is H.

9. The method as claimed in claim 6, wherein said second solvent is of formula (IIb).

10. The method as claimed in claim 1, wherein said second aromatic solvent is selected from ethoxybenzene, 2-methylanisole, 3-methylanisole, 4-methylanisole, 1-ethoxy-2-methylbenzene, 1-ethoxy-3-methylbenzene, 1-ethoxy-4-methylbenzene, acetophenone, tetralin, 1,2-dimethoxybenzene, 1,3-dimethoxybenzene, 1,4-dimethoxybenzene, 1-methoxy-2-ethoxybenzene, 1-methoxy-3-ethoxybenzene, 1-methoxy-4-ethoxybenzene, ethyl benzoate, 1,2-diethoxybenzene, 2-methyl acetophenone, 3-methylacetophenone, 4methylacetophenone, 2-ethylacetophenone, 3-ethylacetophenone, 4-ethylacetophenone, 1,3-diethoxybenzene, 1,4-diethoxybenzene, 2-methoxyacetophenone, 3-methoxyacetophenone, 4-methoxyacetophenone, ethyl 2-methylbenzoate, ethyl 3-methylbenzoate, ethyl 4-methylbenzoate, ethyl 2-ethylbenzoate, ethyl 3-ethylbenzoate, ethyl 4-ethylbenzoate.

11. The method as claimed in claim 1, wherein said second aromatic solvent is selected from 2-methylanisole, 1,3-dimethoxybenzene, ethylbenzoate and tetralin.

12. The method as claimed in claim 1, wherein said polymeric semiconductor comprises a repeat unit of formula (IIIa):

(IIIa)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;
and a repeat unit of formula (IIIb):

(IIIb)

wherein $Ar^1$ and $Ar^2$ are the same or different and each is selected from an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;
$R^3$ is an alkyl group having from 1 to 8 carbon atoms or a phenyl group which may be unsubstituted or substituted with an alkyl group having from 1 to 8 carbon atoms;
and n is an integer greater than or equal to 1, preferably 1 or 2.

13. The method as claimed in claim 12, wherein said polymeric semiconductor is TFB [9,9'-dioctylfluorene-co-N-(4-butylphenyl)-diphenylamine]n wherein n is greater than 100.

14. The method as claimed in claim 1, wherein said non-polymeric semiconductor is of formula (IV):

(IV)

wherein A is a phenyl group or a thiophene group, said phenyl group or thiophene group optionally being fused with a phenyl group or a thiophene group which can be unsubstituted or substituted with at least one group of formula $X^1$ and/or fused with a group selected from a phenyl group, a thiophene group and a benzothiophene group, any of said phenyl, thiophene and benzothiphene groups being unsubstituted or substituted with at least one group of formula $X^1$; and
each group $X^1$ may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms, or (ii) a polymerisable or reactive group selected from the group consisting of halogens, boronic acids, diboronic acids and esters of boronic acids and diboronic acids, alkenyl groups having from 2 to 12 carbon atoms and stannyl groups.

15. The method as claimed in claim 14, wherein said non-polymeric semiconductor is 16. The method as claimed in claim 1, wherein the weight ratio of said first aromatic solvent to said second aromatic solvent in said solution is in the range 60:40 to 99:1.

17. The method as claimed in claim 1, wherein said solution comprises 0.6-4.5 wt/v % of said polymeric semiconductor, and/or 0.1-2 wt/v % of said non-polymeric semiconductor.

18. The method as claimed in claim 1, wherein at least a part of at least one surface of each of said electrodes is coated with a surface-modifying compound.

19. The method as claimed in claim 18, wherein after evaporation of said solvent, said non-polymeric semiconductor is distributed homogeneously in said semiconducting layer in the direction parallel to the surface of the electrodes on which said surface-modifying compound is present.

20. The method as claimed in claim 1, wherein the non-polymeric semiconductor is a compound comprising a core of at least three fused rings wherein each ring is independently selected from aromatic rings and heteroaromatic rings that are each individually unsubstituted or substituted with one or more substituents selected from the group consisting of unsubstituted or substituted straight, branched or cyclic alkyl groups having from 1 to 20 carbon atoms; alkoxy groups having from 1 to 12 carbon atoms; amino groups that may be unsubstituted or substituted with one or two alkyl groups having from 1 to 8 carbon atoms, each of which may be the same or different; amido groups; silyl groups; alkenyl groups having from 2 to 12 carbon atoms; halogens; boronic acids; diboronic acids; esters of boronic acids; esters of diboronic acids; alkenyl groups having from 2 to 12 carbon atoms; and stannyl groups.

* * * * *

UNITED STATES PATENT AND TRADEMARK OFFICE
CERTIFICATE OF CORRECTION

| | | |
|---|---|---|
| PATENT NO. | : 9,620,718 B2 | |
| APPLICATION NO. | : 14/409804 | |
| DATED | : April 11, 2017 | |
| INVENTOR(S) | : Christopher Newsome | |

It is certified that error appears in the above-identified patent and that said Letters Patent is hereby corrected as shown below:

Claim 6, Column 24, Line 25, delete "selected from"

Claim 6, Column 24, Line 26, delete "selected from"

Claim 10, Column 24, Line 46, delete "selected from"

Claim 10, Column 24, Line 54, replace "4methylacetophenone" with "4-methylacetophenone"

Claim 10, Column 24, Line 61, replace "ylbenzoate, ethyl 4-ethylbenzoate" with "ylbenzoate, or ethyl 4-ethylbenzoate"

Claim 12, Column 25, Lines 42-43, delete ", preferably 1 or 2"

Claim 14, Column 26, Lines 6-7, replace "each group $X^1$ may be the same or different and is selected from the group consisting of (i)" with "each group $X^1$ may be the same or different and is (i) selected from the group consisting of"

Claim 14, Column 26, Lines 17-19, replace "diboronic acids and esters of boronic acids and diboronic acids, alkenyl groups having 2 to 12 carbon atoms and stannyl groups." with "diboronic acids, esters of boronic acids, esters of diboronic acids, alkenyl groups having from 2 to 12 carbon atoms, and stannyl groups."

Claim 15, at Column 26, Line 25, should read:

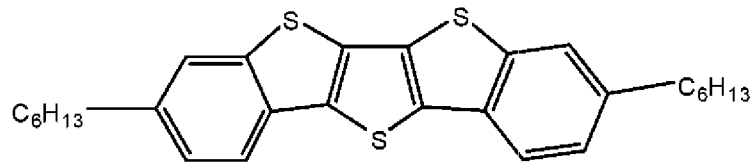

Signed and Sealed this
Sixth Day of June, 2017

Michelle K. Lee
*Director of the United States Patent and Trademark Office*